United States Patent [19]

Eichhorn et al.

[11] Patent Number: 4,775,917
[45] Date of Patent: Oct. 4, 1988

[54] THERMAL COMPENSATED CIRCUIT BOARD INTERCONNECT APPARATUS AND METHOD OF FORMING THE SAME

[75] Inventors: Glen J. Eichhorn, Oakfield; Michael J. Dale; Jerry A. Corfman, both of Fond du Lac, all of Wis.

[73] Assignee: Wells Manufacturing Company, Fond du Lac, Wis.

[21] Appl. No.: 804,100

[22] Filed: Dec. 3, 1985

[51] Int. Cl.⁴ .............................................. H05K 7/20
[52] U.S. Cl. ..................... 361/388; 29/840; 29/843; 357/68; 357/81; 361/386; 361/406; 361/408
[58] Field of Search ............. 174/52 FP, 52 PE; 339/112, 275 B; 357/68, 72, 81; 361/386–388, 392, 394, 403, 404, 405, 406, 408; 29/840–845

[56] References Cited

U.S. PATENT DOCUMENTS

| | | | |
|---|---|---|---|
| 2,752,541 | 6/1956 | Losco | 357/81 |
| 4,115,838 | 9/1978 | Yagusic et al. | 361/388 |
| 4,278,990 | 7/1981 | Fichot | 357/81 |

Primary Examiner—M. H. Paschall
Assistant Examiner—Gregory D. Thompson
Attorney, Agent, or Firm—Andrus, Sceales, Starke & Sawall

[57] ABSTRACT

A circuit board unit includes a substrate with imprinted circuit traces and components. A plurality of traces include connecting areas for connection to another trace area or to an external lead. An interconnect element is soldered to each area. Each element is an integral flat strip-like member bent into a substantial L-shape configuration. The element has a flat, square base plate with a control hole centrally located therein. A terminal leg is interconnected to the base plate by a smoothly curved portion and extends at right angles to the base plate and is aligned with the center of the hole. The outer end is a flat terminal having a pin-like projection. A solder paste on the trace has a configuration conforming to the base plate. The base plate is placed on the solder with a slight pressure. Upon melting of the solder, the hole essentially prevents floating of the element while the conformed plate and paste area align the plate on the solder area as a result of surface tension and wetting effect. The interconnect elements are formed as a series of stamped flat blanks, connected on one edge by a strap having indexing openings for automated movement from a reel supply. The blanks are advanced into a pneumatic forming machine, where it is formed and removed from the strap. A placement head grasps the terminal end of the formed element and places it onto the solder pad. The substrate moves through a reflow soldering unit to solder the interconnect element to the substrate trace. The substrate is placed in a housing with the element abutting an exterior terminal for automated pinch welding.

18 Claims, 2 Drawing Sheets

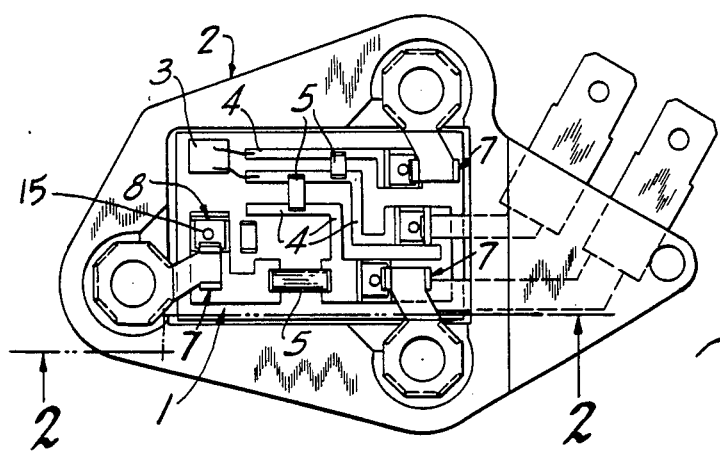
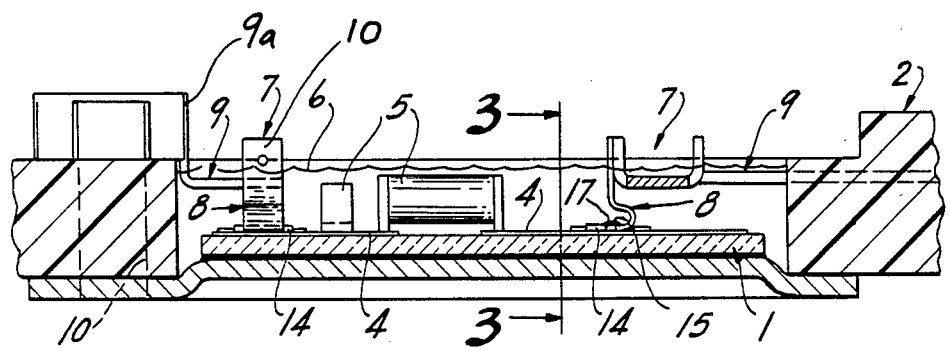
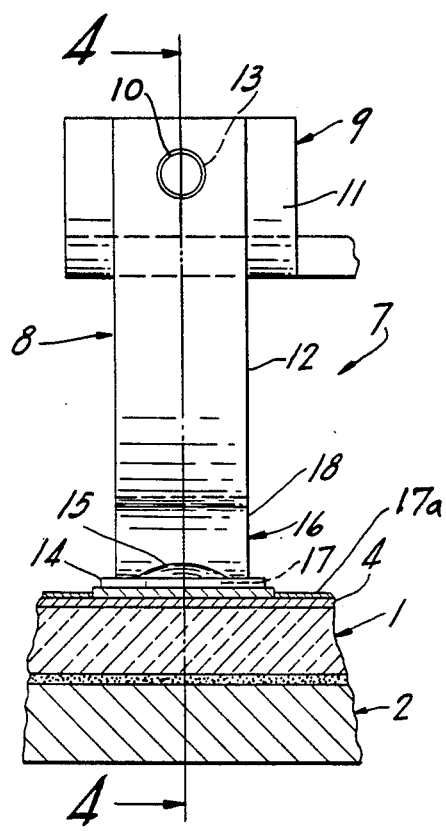
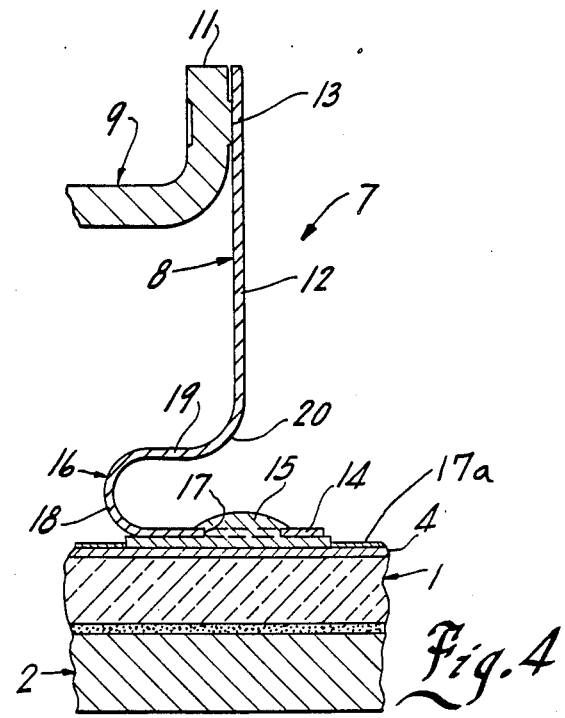

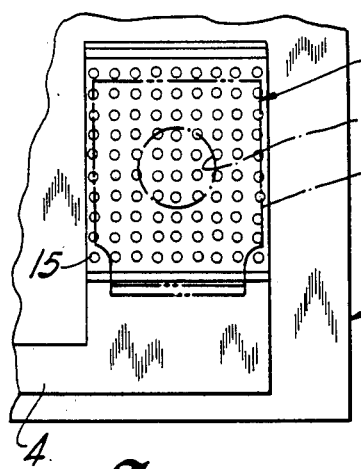
Fig.5
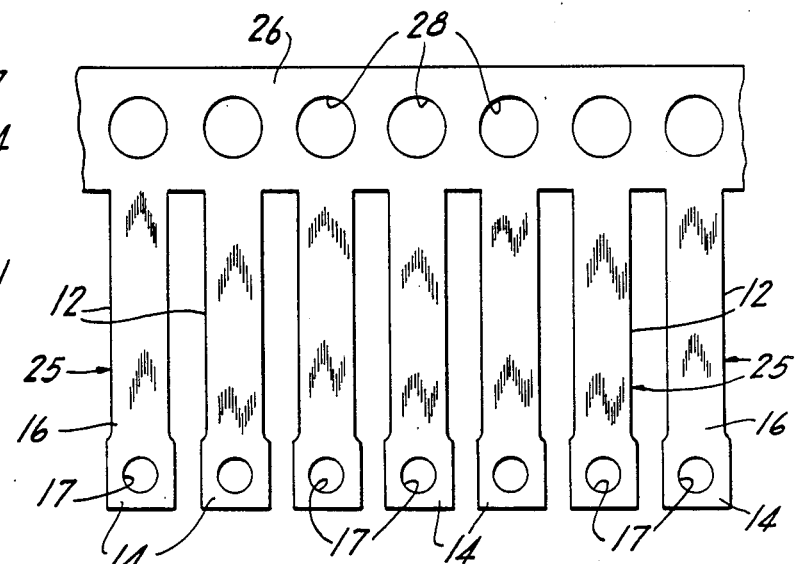
Fig.6
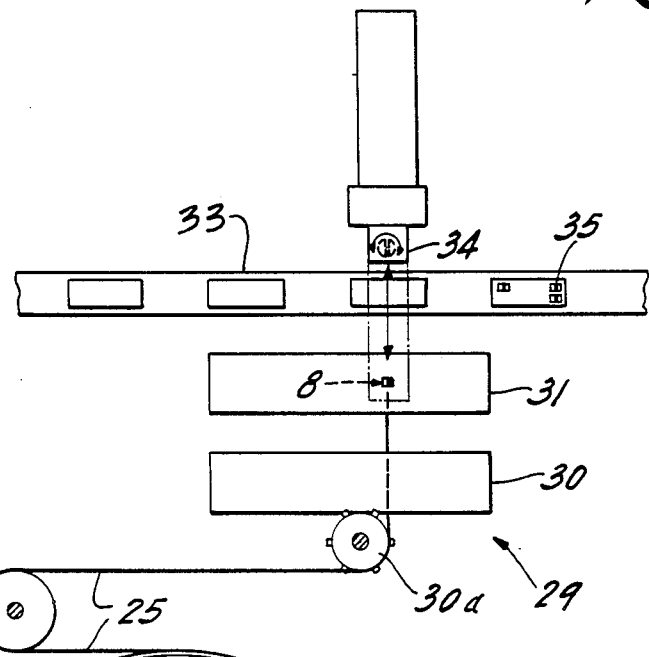
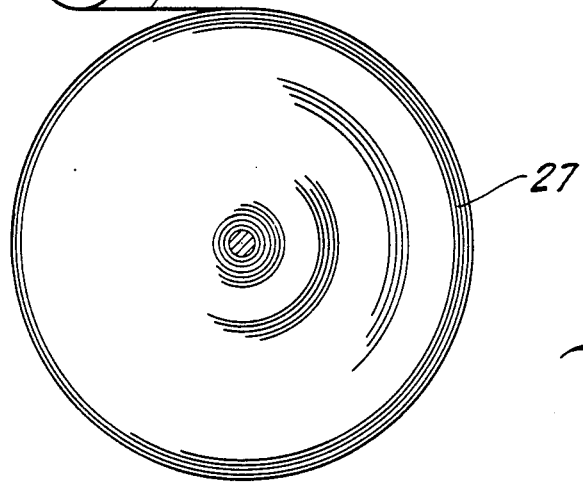
Fig.7

4,775,917

THERMAL COMPENSATED CIRCUIT BOARD INTERCONNECT APPARATUS AND METHOD OF FORMING THE SAME

BACKGROUND OF THE PRESENT INVENTION

The present invention relates to a thermal compensated interconnect apparatus for circuit boards and to the method of making such interconnect apparatus, and in particular to such an interconnect apparatus for surface mounted circuit technology.

The development of solid state circuitry in the electronics industry has included a continuous increase in the density of components, simultaneously with the miniturization of components. Printed circuit boards are standard in the electronic industry. The circuit board includes an insulating substrate having circuit connectors and certain passive components printed on at least one side. The circuit board is further formed with very precisely located pin holes defining interconnect points for interconnection of circuit components to the printed components and conductors. Other components are mounted to the board with component leads projecting through connection locating pin holes. Circuit connections are made through the pin holes to the printed conductors by soldering to the back side of the circuit board at the respective pin holes. Although such circuit board technology is standard and with the available significant miniturization has increased component density, it has inherent limitations. Generally only one side of the circuit board is available for circuit component mountings. More significantly, the manufacturing process is relatively expensive because of the precision requirements in the forming of the circuit board with the interconnect pin holes and the like. A more recent development includes surface mounted technology wherein the components are mounted directly on a given printed substrate surface, with a direct interconnect between the printed conductors and associated printed components and separate surface mounted components. The surface mounted technology permits a significant increase in the component density as well as reduced cost. Even though surface mounted technology has several advantages, the interconnection of the main incoming power terminal to the surface mounted circuit has presented a particularly difficult problem. The main leads and terminals require relatively heavy interconnect conductors to accommodate the necessary current and voltages. The current loads, particularly with the miniaturization of the circuit components introduces thermal factors which must be considered in the system design. The art has recognized that the interconnect apparatus to the circuit must compensate for relative thermally induced movement of the interconnect apparatus between the circuit board terminals and the lead frame terminal. The prior art has generally used manual wiring of appropriate compensating conductors between the circuit board terminals and the lead frame terminals. The manual systems are not only costly but highly dependent on the skill of the operator to maintain appropriate quality standards. Alternatively, relatively sophisticated and costly automated systems have been suggested and used. For example, General Motors, in its manufacturing systems, have developed automated systems for placing and interconnecting of a compensating lead which is soldered to the circuit board and welded to the main frame lead. Fairchild Industries, Inc. in the manufacture of electronic assemblies uses a strip conductor for interconnecting of an external terminal to a circuit board base conductor. Generally, a plurality of interconnect elements are joined by common mounting strip and aligned in a linear fashion on the circuit board. Each of the individual interconnect strips are formed into a generally offset configuration with a small tab portion adapted to be aligned with the external aligned terminals and a 90° offset base portion adapted to be aligned with a significantly larger solder area on the circuit board. The terminal tab and the circuit board base are interconnected by a relatively large integral curved portion to introduce flexibility into the interconnect element for accomodating thermal conditions and the like. After placement, the mounting portion is cut away to establish the desired individual interconnections. Although the final interconnect provides a thermally compensated connection, the manufacturing process does not appear to be adapted to versatile automated processing. The orientation of the interconnect structure is quite confined by the alignment concept. In many applications the electronic circuit board may not be particularly adapted to produce the alignment of the several terminals in one line as required by strip-type assembly. Rather, a more individualized placement and completion of the interconnect elements is desirable in a production facility for forming of widely differing electronic circuits. The solder connection to the circuit board is generally required to permit the low temperature interconnection required by the sensitivity of the circuit board component and the fragile circuit board connections. The lead frame connection is spaced from the circuit board connection and is more fully adapted to a higher temperature welded connection. Where the sophisticated machinery or system heretofore suggested is not economically feasible, the manual wiring and soldering connections are more widely used. Further, the lead wires used in the interconnect are often fragile and may be subject to short life in the field.

These as well as other difficulties and the highly developed state of the pin-hole connection systems have significantly limited implementation and use of surface mounted technology in the electronic arts. There is therefore a significant need and demand for a relatively low cost, automated interconnect apparatus and method which can maintain a high quality interconnect in the normal environment encountered by modern electronic circuitry.

SUMMARY OF THE PRESENT INVENTION

The present invention is particularly directed to a thermal compensated interconnect apparatus and method of forming the same, which can be conveniently and readily adapted to automated mass production processes with a resulting efficient and long-life thermally compensated interconnection between a circuit board wiring trace and an external circuit terminal. Generally in accordance with the present invention, a special shaped interconnect element includes a first base plate portion adapted to be adhesively affixed to a trace portion on the circuit board or substrate by a conductive adhesive material and having an internal control opening to receive the conductive adhesive material. A second offset terminal portion is spaced from and projects outwardly of the base plate portion into alignment with an external terminal. The base plate portion and the terminal portion are interconnected by a curved offset portion defining an area permitting flexible relative movement between the base portion and the terminal portion under varying thermal conditions. In accordance with the teaching of the present invention, the base plate portion is preferably specially formed as a plate-like member having a hole or opening located within the base plate. The base plate is adapted to abut a predetermined adhesive paste area or pad on the printed substrate. The adhesive paste with present day technology is solder and such terminology is used herewith to generally define an activable adhesive which forms a liquid and then changes to a solid conductive connection. The solder paste area and the outer configuration of the base plate are essentially the same. In the soldering operation, the molten solder moves up into the opening and the surface tension between the conformed base plate and the solder paste area establishes a physical orientation and alignment of the terminal interconnect. The hole and the design of the paste pad thus promote the physical orientation for improved soldering. The hole in the base plate particularly prevents floating of the interconnect element during the soldering operation and significantly contributes to the creation of an effective and reliable connection of the interconnect strip to the circuit board. The hole increases the soldered area interface and further contributes to the strength of the electrical and physical connection to the substrate terminal.

The outer terminal portion of the interconnect element is welded or otherwise reliably affixed to the external terminal. The external terminal in a preferred construction includes a small lateral struck-out projection or a pimple which is welded to the external lead. The small projection insures a sound electrical and physical welded connection.

The present invention maintains the necessary flexibility within the interconnect element to compensate for varying thermal conditions. The manufacturing process with the particular interconnect strip provides for very accurate and reliable placement of the element and minimizes and essentially eliminates movement of the interconnect element during the manufacturing process. The design provides a rugged interconnect element, and one which can be more readily manipulated and handled during an automated circuit interconnection. The strip is readily constructed to accommodate both the soldering and welding to nickel coated and nickel alloy coated steels and the like. This is particularly significant with recent development and demand for use of such material in the electronic circuit connections while maintaining soldering to the circuit board and the welding to the external terminal lead.

More particularly in a preferred construction of the present invention, the thermal interconnect element is formed as an integral flat strip-like member which is bent into a substantial L-shape configuration. The L-shape member includes the flat base plate which is formed with one or more sharp corner portions, and generally will be conveniently formed as a rectangular, and preferably an essentially square, flat plate. A control hole of substantial size is centrally located within the base plate and may have a diameter for example equal to approximately 50% of the total width of the plate. The angulated terminal leg is formed to extend at essentially right angles to the base plate and is located generally in alignment with the center of the control hole. The terminal leg is interconnected to the base plate by a smoothly curved interconnecting wall portion. The curved wall portion includes a first curved portion extending from the edge of the plate upwardly toward the terminal leg and terminates in a generally horizontal portion extending from a plane perpendicular to the edge of the base plate. A second curved portion is interconnected between the first curved wall portion and the perpendicularly oriented terminal strip. This terminal leg is also preferably formed as a flat planar strip which is essentially maintained in precise perpendicular relationship to the flat base plate. The solder connector pad on the circuit board is formed as a prepasted mounting pad having a configuration essentially corresponding to but slightly larger than the square configuration of the base plate. The base plate is mounted in overlying alignment to the solder pad under a slight pressure state such that the solder paste moves into the hole, and essentially prevents floating as previously described during the subsequent soldering operation.

The interconnect strip must be maintained in proper orientation to the substrate in order to maintain the desired precise location with the subsequent aligned lead terminal. The rectangular conformed configurations of the base plate and the solder pad further contribute to proper orientation as a result of surface tension and wetting effect of the molten solder.

In the preferred construction and method of carrying out the attachment of the unique terminal interconnect strip, the interconnect elements are formed as a series of stamped flat strips, one for each element, interconnected to each other at the terminal end by a connecting strap. Each strip has the base plate formed with the control opening. The supply is wound onto a reel for convenient handling and processing. Indexing openings are provided in the interconnecting strap for automated movement of the reel supply through a suitable automated forming and mounting line. The reeled supply is for example, step advanced into a suitable forming die, such as readily available pneumatic forming machines. The interconnect strip is removed from the connecting strap within the forming machine and then is shaped to the desired L-shaped configuration. The formed part is automatically removed from the die and inserted into a placement head which grasps the terminal end of the formed interconnect strip and moves and places it onto the appropriate correspondingly shaped solder pad on the circuit board or substrate. The substrate is preformed with the printed circuits and may be a purchased item made by a specialty source. A pad of solder paste is applied, for each interconnect element, which may typically be done by silk screening of the solder paste onto the preformed circuit board. The placement head moves the interconnect element onto the pad with slight pressure with the paste moving upwardly into the hole. The placement head is then removed and the substrate moved through a reflow soldering station to establish reflow soldering of the interconnect element to the substrate, assembly with the outer housing and welding of the interconnect elements to the lead frame. This results in the direct desired orientation and placement of the terminal portion of the interconnect element with the correspondingly shaped portion of the lead frame terminals. The placement of the housing and the substrate is readily established with sufficient precision to establish a subsequent automated welding of the abutting or adjacent terminal portion of the interconnect element and the main lead frame terminal. Thus in a preferred embodiment, a robotic head moves into operative engagement with the abutting terminal members and effects a pinch weld between the abutting members. The metals of the interconnect strip and the lead frame of the terminal are of course formed of compatible material particularly adapted to pinch welding such as nickel coated steels.

The present invention has been particularly adapted to thick filmed assemblies specially using surface mounted technology and in particular such electronic assemblies adapted for use in automotive engines and the like. The product specifications require thermal cycling over the range −40° to +125° C. without disruption or degradation of the interconnect. Further, in automotive use and the like it will be recognized that long life is essential, particularly in accordance with modern day quality standards which are being set for various electronic applications. In summary, the present invention provides a unique type circuit board interconnect which readily compensates for widely varying thermal conditions while permitting the reliable and effective interconnection in a mass production of the product at a resonable cost and with an improved interconnection between the lead frame terminals and the interconnect to the circuit board or substrate.

BRIEF DESCRIPTION OF DRAWINGS

The drawings furnished herewith generally illustrate the best mode presently contemplated for the invention and is described hereinafter.

In the drawings:

FIG. 1 is a plan view of a electronic circuit module incorporating a thermal interconnect apparatus in accordance with the teaching of the present invention;

FIG. 2 is an enlarged fragmentary view taken generally on line 2—2 of FIG. 1 and more clearly illustrating the interconnect apparatus constructed in accordance with the teaching of the present invention;

FIG. 3 is an enlarged vertical section taken generally on line 3—3 of FIG. 2 and more clearly illustrating an interconnect element;

FIG. 4 is a front view of FIG. 3 looking from the right side of FIG. 3;

FIG. 5 is an enlarged fragmentary view illustrating the connection between an interconnect element and a circuit substrate trace;

FIG. 6 is a plan view of the thermal interconnect blanks for automated forming and assembly; and FIG. 7 is a diagrammatical illustration of an automated assembly line for automated forming and attachment of the thermal interconnect blanks to the module, such as shown in FIGS. 1 and 2.

DESCRIPTION OF ILLUSTRATED EMBODIMENT

Referring to the drawings and particularly to FIGS. 1 and 2, a circuit board or substrate 1 is shown mounted within a correspondingly shaped opened top housing 2. The substrate 1 is a relatively thin flat circuit board formed of a suitable insulative material. Various electrical components 3 are affixed to the upper surface as by imprinting on the upper surface with preprinted circuit conductors 4 forming a flat plate-like terminal for interconnecting and joining of the several surface mounted components. In addition, other passive and active components 5 are mounted to the circuit board 1 and connected to the proper conductors 4. In the illustrated embodiment of the invention, surface mounted technology is used wherein all of the electrical components and the printed circuit conductors are secured to an outer imperforate face of the substrate 1. The completed subassembly of the substrate 1, with the several electrical components 3 and 5, is secured to the base wall of the housing 2 in any conventional or desired manner to support the subassembly within the housing recess. A potting plastic 6 such as a clear insulating gel covers the circuit board and all of the circuit components 3 and 5 for purposes of isolating the electronic circuitry from the surrounding environment. External connections are made to the circuit board 1 for transferring power to and from the circuit through special connector assemblies 7 spaced about the substrate 1 and the housing 2. Each of the connector assemblies 7 includes an interconnect element 8 shown as a special conductive strip having the inner end interconnected to the appropriate printed conductor 4 on the substrate 1. The element 8 projects outwardly of the recess and the outer end is interconnected to a lead frame terminal 9 appropriately secured to or embedded within the housing. Various forms of terminals 9 may of course be provided. Conventional spade type terminals may be embedded within the wall of the housing 2, with the lead frame terminal projecting into the housing for interconnection with and to the interconnect elements 8. Terminals having a cap 9a mounted on the bolt projection, or boss, of the housing and having the terminal portion projecting into the recess are used for effective automatic grounding of the connection upon the bolting of the insulation housing 2 in place. The external terminals may be formed with a U-shaped tab end as shown in FIGS. 1 and 2 to permit connection of two of the substrate interconnect elements.

The present invention is particularly directed to the connector assemblies 7 and the method of forming the interconnect elements 8 and the placement and connection of the elements to the conductors 4 and to terminals 9. The substrate 1 with the surface mounted technology, the housing 2 and the lead frame terminals 9 as such may be of any desired known configuration and construction. As such technology is well known and will be readily understood by those skilled in the art, no further description or explanation thereof is given other than as necessary to clearly describe the illustrated embodiment of the invention.

In the illustrated embodiment of the invention and particularly as more clearly shown in FIGS. 2-5, the lead frame terminal 9 includes a connecting extension which projects laterally into the housing recess in overlying relationship to the substrate and generally in alignment with the desired connection assembly on 7 the substrate 1. The extension terminates in a vertical connection tab 11 having a small lateral projection 10, which is aligned with the special thermally compensated interconnect element 8. The projection 10 may be formed by a simple struck-out portion in the center of tab 11. The interconnect element 8 is a specially formed conductor and includes a flat vertical conductor leg 12 in a form of a flat connector strip 12, which in the proper assembled relation of the assemblies is located adjacent and in abutting engagement with the corresponding tab 11 and particularly the projection 10. A pinch weld 13 interconnects the upper end of leg 12 to the projection 10 of tab 11 and establishes a effective and efficient electrical connection therebetween.

The vertical leg 12 of the interconnect element is connected to a base wall or plate 14 which is located at substantially perpendicular relationship to the leg 12.

The base plate 14 is a flat plate-like member which abuts the appropriate printed conductor 4 of the substrate 1. A solder pad 15 establishes an efficient and effective electrical connection of the base plate 14 and therefor element 8 to the circuit conductor 4 of the circuit board and thereby completes the external lead connection assembly 7. The base plate 14 and the vertical leg 12 of the interconnect conductor are connected by a special curved connected wall portion 16 to establish a flexible interconnection therebetween and permitting relative movement therebetween as the result of thermal variations in the thermal condition and any other relative source movement therebetween.

In accordance with one significant feature of this invention, the base plate 14 is particularly interconnected to the printed circuit conductor 4 by a solder pad 15 essentially corresponding in configuration to the configuration of the base plate 14. In addition, the base plate 14 is especially formed with a central opening or hole 17 through which the solder 15 projects. As more fully developed hereinafter, the opening 17 in the base plate 14 and the conformance of the configuration of the solder pad 15 and the base plate 14 separately and conjointly function to create a reliable effective and improved interconnection of the conductive interconnect element 8 to the terminal 9 and to the conductor 4 and particularly adapts the assembly 7 to automated assembly of the circuit board subassembly.

Generally, during the manufacture, the substrate 1 is preprinted with the desired printed conductors 4 and printed circuit component 3. The several components 5 are physically and electrically connected in place. A solder paste 15 is then applied to the substrate 1 at the interconnection points, such as by a known silk screening process or any other suitable means. The solder paste 15 is applied in a configuration corresponding to that of the base plates 14, as shown in FIG. 5. A solder dam 17a is imprinted on the trace conductor to confine the solder during the reflow soldering operation, and thereby the interconnect element. The interconnect elements 8 and particularly the base plate 14 is then pressure applied to the solder paste 15, with a slight pressure, to locate the terminals elements 8 thereon and with the solder paste 15 moving into the opening 17. Subsequently, the solder paste 15 is heated to a molten state to solder the interconnect element 8 and particularly plate 14 to the substrate conductor 4. The movement of the paste 15 into the opening 17 essentially eliminates any tendency for the interconnect element 8 to float on or in the molten solder and thereby contributes to maintaining the preset orientation of the interconnect element 8. The paste 15 can move freely through the opening and during the reflow process can move back between the substrate and base by capillary action to insure adequate solder for the joint. Although solder is presently widely used for establishing circuit connections, other materials might be used. For example, a silver epoxy mixture has been used in forming of circuit board connections. Such material is applied in a liquid or semi-liquid state and allowed to cure to a solid state as a result of chemically generated heat and/or accelerated through the use of applied heat. With the rapid development of technology, other forms of flowable connecting material may be developed which can be used in such state to make a subsequent solid connection, and may form a suitable substitution for the materials presently available. Further, the conformance between the solder pad formed by the past 15 and the base plate 14 further contributes the interconnect element orientation. Thus, the wetting of the base plate 14 and the surface tension phenomena between the molten solder paste 15 and the base plate 14 contribute to establishing and maintaining the proper orientation of the interconnect element 8. Although the plate 14 and solder paste 15 are shown of a square configuration, any other configuration including at least one sharp corner structure which will establish a given orientation may be used. The rectangular structure has been found to provide satisfactory practical application. The interconnect element 8 is thus precisely and accurately located on the substrate. When the substrate 1 is now placed in the housing 2, the interconnect elements 8, and particularly the upper terminal strip end of each of the terminal legs 12, is accurately and precisely located with respect to the corresponding terminal tabs 11 of the lead frame terminals 9. The terminals can be readily pinch welded as at 13 or otherwise interconnected to complete the circuit connection. The small projection 10 on terminal tab 11 establishes a point-like contact point. The weld current is thus concentrated in small area and the high current density results in a particularly effective and reliable electrical connection. The lead terminal 9 may be formed on elongated strips embedded within the wall of the housing 2 or separate members affixed to the housing as by a portion mating with mounting bolt embossments on the housing. The inner ends of the terminals may advantageously be formed with U-shaped tab portions. Thus defining a pair of integrally formed upstanding tabs for forming of common connections. The whole process is readily adapted to automated production in a high speed production line thereby particularly adapting the assembly to large mass productions required in various electronic technologies.

More particularly in the preferred illustrated embodiment of the invention, the interconnect element 8 is shown as a relatively thin metal strip formed with the base plate 14 formed as a flat plate-like member and the terminal leg 12 as a flat elongated flat strip interconnected to each other by the special interconnecting curved wall portion 16.

The flat base plate 14 of the interconnect strip is shown as a rectangle and, for purposes of illustration as an essentially square configuration. The opening 17 is centrally located within the base plate 14 and has a diameter equal approximately to 50% of the width of the base plate. The curved wall portion 16 is integrally formed with the one edge of the base plate 14. The curved portion 16 is sligthly less in width than the base plate 14 and curves outwardly therefrom with an essentially constant radius as at 18. The curved wall portion 18 is a semi-circular wall with the upper end connected by a small horizontal portion 19 parallel to the base plate 14. A second curved portion 20 extends from the horizontal portion 19 in a reverse direction to the vertical terminal leg 12. The second reverse curved portion 20 spans essentially 90° and terminates in a plane perpendicular to the base plate 14 so as to locate the terminal leg 12 projecting outwardly at and perpendicular to the base plate 14. The curved portions 18 and 19 are constructed and arranged to locate the terminal leg 12 essentially in alignment with center of the hole 17 in the base plate 14.

To accommodate the precision requirements for an efficient terminal connection, the flat base plate 14 and the terminal leg 12 are rather precisely formed. Thus the flat plate in a practical embodiment has a specification of flatness after forming within 0.005 total indicator reading (TIR). Similarly, the one surface of the leg was specified to be perpendicular to the surface of the base plate within the dimension of 0.003 inches between the outermost edge of the base plate 14 and the adjacent surface of the flat terminal leg 12. The interconnect element 8 is preferably formed of an appropriate conductive terminal steel or steel alloy with a nickel or nickel-zinc coating. Such material is particularly adapted to both welding and soldering and thus is particularly adapted to forming of an interconnect in an electronic circuit.

In a practical construction, the interconnect element 8 was formed with a square base plate 14 of approximately 0.110 inches. The element was formed of a flat strip having a nominal thickness of 0.008 inches. The curved portion 16 had a depth of 0.62 inches, with curved portion 18 having a curvature portion 20 of 0.023 inches. The reverse curvature had a radius of 0.62 inches maximum located to space the attachment face of the contact terminal leg 0.050 inches from the outer edge of the base plate 14, and in a plane perpendicular to the base plate the dimension of 0.050 inches was within a ±0.003 inch tolerance. The opening 17 had a diameter of approximately 0.050 inches.

Although the dimensional relationship of the interconnect is not critical, the above is one typical illustration of a highly satisfactory interconnect element which has been employed in connection with the practical implementation of the present invention as applied to an electronic circuit.

The interconnect element 8 is formed as a flat metal strip to established the desired rigidity for self support of the interconnect element during the assembly. The element 8 may therefore be formed as a free standing element resting on the base plate 14 and further when applied to solder paste 15 will remain on place. The curved interconnection however introduces the necessary flexibility into the unit to permit relative movement under normal operating conditions including a wide temperature variation. Thus the interconnect strip as described above operates well within a thermal range of −40° Centrigrade to +125° Centrigrade.

This invention thus provides not only improved interconnect but one which is readily adapted to automation.

For example as shown in FIGS. 6 and 7, a typical circuit fabricating line is shown. The interconnect elements 8 are formed as a part of an elongated series of similar flat interconnect blanks 25 interconnected to each other by an interconnecting strap 26 at the end of the terminal leg portion 12. Each of the interconnect blanks 25 is shown as a elongaged flat strip member having the outer end formed to the configuration of the square base plate 14 with the appropriate centered hole 17. The curved portion 16 and the terminal leg 12 are formed as a narrowed integral extension from the square plate 14 to the connecting strap 26. The terminal leg 12 is formed of a length equal to the maximum length which may be required in various applications within any given manufacturing system or line. The interconnecting strap 26 permits winding of the assembly onto a reel 27 for convenient handling and manipulation during the forming and assembly process. The strap 26 is provided with a plurality of equally spaced holes 28, one for each of the interconnect elements blanks 25. The reel 27 is mounted in an automated forming and assembly line 29, which shown adapted to receive the reel 27 mounted with a vertical axis of rotation. An automatic feeding machine 30 includes a drive unit 30a coupled to holes 28 and providing for indexed movement of the respective terminal blanks 25, in a vertical orientation, into a forming machine 31, wherein the blank is shaped into the L-shaped configuration shown in FIG. 4. The forming machine 31 may be of any construction such as a conventional pneumatic forming machine which severs the blank 25 from the strap 26 to the programmed length and forms the curved wall portion 16 with the square based plate 14 in perpendicular and spaced relation to the terminal leg 12. The formed unit moves from the forming unit 31 with the terminal leg 12 cut to the programmed length for the particular application and presents the formed interconnect element 8 with terminal leg 12 oriented for automated transfer onto a substrate 1 carried by a transverse conveyor 33. A placement head 34 moves into alignment with the interconnect element 8, picks the interconnect element from the forming machine and after movement into appropriate alignment with the substrate 1 on conveyor 33 moves the element 8 downwardly with the base plate 14 moving into pressurized engagement with the prepasted solder paste 15. The placement head 34 will effect a slight pressure engagement permitting the solder paste 15 to move into the opening 17 and locate the plate 14 in square registry with the square solder paste 15. The substrate 1 with all of the interconnect elements 8 appropriately located in position is automatically processed through a reflow station and assembled with the housing. As previously noted, the opening 17 and conformance between the plate 14 and the solder paste 15 insure the maintenance of the accurate location of the interconnect strip during the reflow soldering operation. Thus, even if the interconnect element and particularly, the base plate 14 is not precisely located on the paste 15, the corresponding configuration of plate 14 and pad 15 results in the element 8 moving to the desired aligned position as the result of the surface tension of the molten solder.

The substrate with the interconnect elements 8 is placed in the housing with reasonably precise location of the terminal leg of the interconnect element and the tabs of the lead frame terminals established. The lead frame terminals which are embedded, or separately secured to the housing are located to provide flexible abutting engagement between the terminal projections and the terminal leg 12 of the interconnect element 8. The lead frame terminal may have a connecting tab of a somewhat greater width than that of the terminal legs of the interconnect strips. This of course minimizes the required precision in the lateral placement of the members and provide for somewhat greater tolerance in this orientation.

After proper orientation, the pinch welding head, not shown, moves into engagement to effect the welded interconnection between the interconnect strips and the lead frames.

In summary, the interconnect element 8 is formed and applied to the solder paste 15 in proper alignment. The square contact plate 14 is thus properly aligned on the solder paste 15 with the upper end of the contact leg 12 properly located for abutting engagement with the tab 11 of the lead frame terminal 9. The interconnect element 8 is secured and placed by reflow soldering, for example. The hole or opening 17 in the square plate 14 as previously described ensures the accurate and precise orientation of the interconnect element. After the complete subassembly is formed, the substrate 1 is placed into the housing 2 with the terminal leads tabs 11 abutting the terminal legs 12 of the several interconnect element on the circuit board and pinch welded in place.

The present invention is thus particularly adapted to automated processing of the total electronic assembly and in particular provides an improved interconnect assembly at the critical position, namely, the interconnect between the external circuit connections and the circuit board connections.

Various modes of carrying out the invention are contemplated as being within the scope of the following claims particularly pointing out and distinctly claiming the subject matter which is regarded as the invention.

I claim:

1. A circuit interconnected element interconnecting a printed circuit substrate module having an external terminal, comprising a flat plate-like terminal means, a terminal member having a flat base means mounted in abutting engagement with said flat plate-like terminal means with a conductive adhesive interconnection therebetween, said base means having a transverse locating opening extended through the base means and defining an adhesive passage receiving said adhesive, said adhesive being located between said flat plate-like terminal means and said base means and projecting into said opening, said member having an outer terminal means and a curved interconnecting portion interconnected between said base means and said outer terminal means, said curved portion being constructed to permit relative movement of said outer terminal means relative to said base means with varying temperatures.

2. The interconnect element of claim 1 wherein said terminal member is formed of a self-supporting highly conductive metal whereby said terminal member is placed on said terminal means and its orientation is maintained.

3. The interconnect element of claim 1 in combination with said terminal means wherein said adhesive is located at least in a flowing state to create a wetting and surface tension, and said terminal means and said base means each having at least one corresponding corner configuration whereby the wetting and surface tension of said adhesive establishes an alignment force on said terminal member to force said corners into alignment.

4. The interconnect element of claim 1 wherein said member is formed of a steel having an outer coating including nickel and is adapted to be joined to an external power connector of steel having a coating including nickel.

5. The interconnect element of claim 1 wherein said curved interconnecting portion (16) includes a substantially semi-circular portion (18) connected to the edge of said flat base means (14) and terminating in a horizontally located outwardly spaced end (19), a second outwardly reversed curved portion (20) secured to said spaced end (19) of said semi-circular curved portion (18) and connected to a terminal leg terminating in a terminal end portion (13) extending essentially perpendicular to said base means (14) and integrally joined with said terminal leg (12), said terminal leg (12) being constructed and arranged to locate said terminal end portion in outwardly spaced aligned relation to said locating opening (17).

6. The interconnect element of claim 5 wherein said terminal leg is aligned with said base means in outwardly spaced relation thereto, said terminal leg being of a flat strip-like member located essentially perpendicular to the flat base means.

7. The interconnect element of claim 6 wherein said terminal leg is essentially aligned with the center of said locating opening.

8. The interconnect element of claim 6 wherein the terminal leg includes a laterally extending projection, said projection adapted to be welded to said external terminal.

9. An electronic circuit board module, comprising a housing having an open top recess and a substrate secured within the housing having a face exposed through said open top recess, said substrate including a plurality of printed conductors and surface mounted components secured within said recess to said face of said substrate, said printed conductors including at least one interconnect area including a solder paste of a predetermined extended configuration, said housing having at least one lead frame terminal secured to the housing and projecting inwardly over said interconnect area, an interconnect element connecting said solder paste to said lead frame terminal, said interconnect element including a flat base plate having a generally centrally located opening, said base plate abutting said solder paste with said solder paste projecting into said opening, said interconnect element having a curved flexible portion extending from one edge of said base plate and curving outwardly and backwardly over said base plate and terminating in an outwardly projecting contact leg.

10. The circuit board module of claim 9 wherein said interconnect element includes said contact leg located substantially perpendicular to said base plate and having an outer portion abutting said lead frame terminal, and means connecting said lead frame terminal to said outer portion.

11. The circuit board module of claim 10 wherein said contact leg is aligned with said centrally located opening.

12. An electronic circuit assembly having a substrate with surface mounted electrical components and interconnecting printed circuit conductors including electrical interconnect elements for connecting selected printed conductors portions to external lead terminals mounted in fixed relation to said circuit substrate, comprising electrical solder paste fixed to portions of said selected printed conductors, said paste having a predetermined outer configuration and each portion and paste defining an external circuit interconnect point, each of said electrical interconnect elements including a contact base plate of an outer configuration essentially conforming to said outer configuration of the solder paste, said plate having a central opening, said solder paste projecting upwardly into said opening and being soldered to the undersurface of said contact base plate and the edges of said opening, an integral curved extension secured to an edge of said contact base plate and curving laterally and outwardly to a parallel portion located outwardly in spaced parallel relation to said base plate, a reverse curved portion extending from said parallel portion and curving outwardly of said contact plate in a plane essentially perpendicular to said contact base plate, and an integral terminal strip secured to the outer end of said second curved portion and projecting outwardly with the strip essentially perpendicular to said contact base plate, one of said external lead terminals having a connecting flat tab located in abutting relation to the upper end of said terminal strip, and a weld interconnecting said tab to said terminal strip to establish a firm electrical contact therebetween.

13. The electronic circuit assembly of claim 12 including an open top housing having a recess with a base, means securing said circuit board to the base of said recess with the surface mounted components facing outwardly of said recess, said external lead terminals being secured to the walls of said housing and projecting inwardly with the tab in a plane generally perpendicular to the base of said recess.

14. The method of forming an electrical interconnect in an electronic assembly for interconnecting of surface mounted electrical components into circuit with an external terminal means, comprising assembling a circuit board including a substrate having printed conductors and electrical printed components on one surface and external components surface mounted to said same surface and interconnected to said printed conductors, establishing solder paste onto selected portions of said printed conductors and defining external circuit interconnect locations, said solder paste having a predetermined outer configuration, forming an interconnect conductive element including a flat base plate having an outer configuration essentially conforming to said solder paste and having a central opening, said interconnect conductive element being formed with a curved connect portion extending from one edge of said base plate and curving outwardly and backwardly over the base plate to an outwardly projected terminal strip, said terminal strip being located in perpendicular relationship to said base plate, locating said base plate abutting said solder paste and the configuration of the base plate oriented in essentially superimposed conformance to the solder paste, applying said interconnect element under pressure to said paste to cause solder paste to move into said opening, melting said solder paste to effect a soldered interconnect of said base plate and said printed conductor to said solder paste and thereby provide electrical interconnection to said printed conductor, mounting said electronic assembly within a recess in a housing, said housing having at least one external lead terminal including a terminal portion located in abutting engagement with said terminal strip, and pinch welding of said portion to the abutting terminal strip.

15. The method of claim 14 wherein said plate and said solder paste are formed in configurations having at least one corner aligned.

16. The method of claim 14 forming solder dams adjacent each said solder paste.

17. The method of claim 14 including the step of providing said interconnect element as one of a series of interconnect element blanks, each of said blanks including a flat strip-like member projecting outwardly from an interconnecting member, said flat base plate of each element being part of said interconnecting member to form a continuous supply of said blanks, feeding said continuous supply into a forming machine to sequentially sever said interconnecting member to remove a blank from the supply and forming said blank into said interconnect element.

18. The method of claim 14 including the step of providing said interconnect element as one of a series of interconnect elements blanks, each of said blanks being a flat strip-like member projecting outwardly from said interconnecting member with the base plate located at the one end and connected along the one end of the blank strips by an interconnecting member to form a supply of blanks, feeding said supply into a forming machine to sequentially sever the blanks from the supply and forming said blanks into said interconnect element, removing said formed interconnect element from said forming machine, applying the element to the solder pad under pressure.

* * * * *

UNITED STATES PATENT AND TRADEMARK OFFICE
CERTIFICATE OF CORRECTION

PATENT NO.   : 4,775,917

DATED        : October 4, 1988

INVENTOR(S)  : Glen J. Eichhorn, et al.

It is certified that error appears in the above-identified patent and that said Letters Patent is hereby corrected as shown below:

Col. 11, line 16, claim 1, delete "interconnected" and substitute therefor --interconnect--;  Col. 14, line 13, delete claims 17 and 18 and substitute --17. The method of claim 14 including forming each said base plate and said solder paste with a rectangular configuration.

18. The method of claim 14 including the step of providing said interconnect element as one of a series of interconnect element blanks, each of said blanks including a flat strip-like member projecting outwardly from an interconnecting member, said flat base plate of each element being part of said interconnecting member to form a continuous supply of said blanks, feeding said continuous supply into a forming machine to sequentially sever said interconnecting member to remove a blank from the supply and forming said blank into said interconnect element.-- therefor.

Signed and Sealed this

Nineteenth Day of December, 1989

Attest:

JEFFREY M. SAMUELS

*Attesting Officer*       *Acting Commissioner of Patents and Trademarks*